(12) United States Patent
Lee et al.

(10) Patent No.: US 11,631,467 B2
(45) Date of Patent: Apr. 18, 2023

(54) DETERMINING READ VOLTAGES FOR MEMORY SYSTEMS

(71) Applicant: Macronix International Co., Ltd., Hsinchu (TW)

(72) Inventors: Yung-Chun Lee, New Taipei (TW); Yu-Ming Huang, Taipei (TW); Han-Wen Hu, Tainan (TW)

(73) Assignee: Macronix International Co., Ltd., Hsinchu (TW)

(*) Notice: Subject to any disclaimer, the term of this patent is extended or adjusted under 35 U.S.C. 154(b) by 52 days.

(21) Appl. No.: 17/321,933

(22) Filed: May 17, 2021

(65) Prior Publication Data

US 2022/0076762 A1 Mar. 10, 2022

Related U.S. Application Data

(60) Provisional application No. 63/075,312, filed on Sep. 8, 2020.

(51) Int. Cl.
| | |
|---|---|
| *G11C 16/26* | (2006.01) |
| *G11C 16/34* | (2006.01) |
| *G11C 16/08* | (2006.01) |

(52) U.S. Cl.
CPC .............. *G11C 16/26* (2013.01); *G11C 16/08* (2013.01); *G11C 16/3404* (2013.01); *G11C 2207/2254* (2013.01)

(58) Field of Classification Search
CPC ..... G11C 16/26; G11C 16/08; G11C 16/3404; G11C 2207/2254; G11C 11/5642; G11C 29/021; G11C 29/028; G11C 16/0483

USPC ................................................... 365/189.011
See application file for complete search history.

(56) References Cited

U.S. PATENT DOCUMENTS

| | | | |
|---|---|---|---|
| 10,210,941 B1 | 2/2019 | Chen et al. | |
| 10,629,272 B1* | 4/2020 | Lu | G11C 16/0483 |
| 10,839,920 B2* | 11/2020 | Cesaretti | G11C 5/145 |
| 2020/0142590 A1 | 5/2020 | Chew et al. | |
| 2020/0258558 A1 | 8/2020 | Prakash et al. | |
| 2022/0044737 A1* | 2/2022 | Khayat | G06F 3/0659 |

OTHER PUBLICATIONS

A 512-Gb 3-b/Cell 64-Stacked WL 3-D-NAND Flash Memory, IEEE journal of solid-state circuits, 2018 (Samsung).

(Continued)

*Primary Examiner* — Huan Hoang
*Assistant Examiner* — Minh Dinh
(74) *Attorney, Agent, or Firm* — Fish & Richardson P.C.

(57) ABSTRACT

Methods, devices, and systems for determining read voltages for memory systems are provided. In one aspect, a memory device includes an array of memory cells, an accumulating circuit, and a controller. Each of the memory cells is coupled to a corresponding word line of multiple word lines and a corresponding bit line of multiple bit lines. The accumulating circuit is configured to: when data stored in a page is read out by applying each of a plurality of read voltages on a word line corresponding to the page, accumulate read-out signals from multiple memory cells in the page to generate a respective output value that corresponds to the accumulated read-out signals for the read voltage. The controller is configured to determine a calibrated read voltage for the page based on the respective output values and the plurality of read voltages.

20 Claims, 9 Drawing Sheets

(56) References Cited

OTHER PUBLICATIONS

A 512Gb 3b/Cell Flash Memory on a 96-Word-Line-Layer Technology, ISSCC 2018 (Toshiba).
English translation of Taiwan Office Action issued in corresponding Application No. TW110126079 dated Apr. 14, 2022.

* cited by examiner

DETERMINING READ VOLTAGES FOR MEMORY SYSTEMS

CROSS-REFERENCE TO RELATED APPLICATION

This application claims priority under 35 USC § 119(e) to U.S. Provisional Patent Application Ser. No. 63/075,312, filed on Sep. 8, 2020, the entire content of which is hereby incorporated by reference.

BACKGROUND

Once memory cells in a data storage device, e.g., a memory system, are programmed, data can be read from the memory cells by sensing a programmed state of each memory cell by comparing a cell threshold voltage to one or more read voltages. However, the cell threshold voltage may change due to one or more factors, such as read disturbance or data retention, which may make the sensed programming states different from the written programmed states and cause failed bits in a reading output of the data. Some existing systems and techniques use the same verified read voltage irrespective of the variation in cell threshold voltage.

One techniques to compensate for changes in the cell threshold voltage includes storing a lookup table with preset read voltages and a priority order. If error correction techniques fail then the system retries reading with different read voltages in the priority order set by the lookup table. Another technique is to use a voltage calibration technique in which the number of on bits is counted at successive voltages to find a "valley", e.g., the voltage with a minimum change in the number of counted on bits.

SUMMARY

The present disclosure describes systems and techniques for determining read voltages for memory systems, e.g., three-dimensional (3D) non-volatile memory (NVM) systems, particularly with on-chip analog-to-digital converter (ADC) circuitry, which can quickly and efficiently determine a calibrated read voltage for reading memory data to thereby improve a performance of the memory systems.

One aspect of the present disclosure features a memory device including: an array of memory cells, each of the memory cells being coupled to a corresponding word line of multiple word lines and a corresponding bit line of multiple bit lines; an accumulating circuit coupled to the array of memory cells and configured to: when data stored in a page is read out by applying each of a plurality of read voltages on a word line corresponding to the page, accumulate read-out signals from multiple memory cells in the page to generate a respective output value that corresponds to the accumulated read-out signals for the read voltage; and a controller coupled to the accumulating circuit and configured to determine a calibrated read voltage for the page based on the plurality of read voltages and the respective output values associated with the plurality of read voltages.

In some embodiments, the accumulating circuit includes an analog-to-digital converter (ADC) configured to convert the accumulated read-out signals into the respective output value.

In some embodiments, a read-out signal includes at least one of a current or a voltage.

In some embodiments, at least one of the accumulating circuit or the controller is configured to record the respective output values.

In some embodiments, the memory device includes control circuitry coupled to the array of memory cells. The control circuitry can be configured to apply each of the plurality of read voltages on the word line by successively applying a read voltage at a sequence of read voltage values. The control circuitry can include the controller.

In some embodiments, the controller and the accumulating circuit are arranged in an integrated circuit.

In some embodiments, the control circuitry is configured to iteratively increase or decrease the read voltage.
A first amount between first adjacent read voltage values can be different from a second amount between second adjacent read voltage values. A first amount between first adjacent read voltage values can be identical to a second amount between second adjacent read voltage values.

In some embodiments, the control circuitry is configured to: determine whether the read voltage with a first read voltage value is beyond a threshold voltage; in response to determining that the read voltage with the first read voltage value is no more than the threshold voltage, increase or decrease the read voltage to have a second read voltage value to be applied for a following read operation on the page; and in response to determining that the read voltage with the first read voltage value is beyond the threshold voltage, activate the controller to determine the calibrated read voltage for the page.

In some embodiments, the controller is configured to: for each of at least two of the read voltage values in the sequence of read voltage values, determine a difference between respective output values for the read voltage value and a second read voltage value immediately preceding the read voltage value among the sequence of read voltage values, thereby providing a sequence of differences.

In some embodiments, the controller is configured to determine the calibrated read voltage based on the sequence of differences and the plurality of read voltages by identifying, from the at least two read voltage values, a particular read voltage value that provides a minimum difference among the sequence of differences, and setting the calibrated read voltage to have the particular read voltage value.

In some embodiments, the controller is configured to: for each of the at least two of the read voltage values, determine a second difference between respective differences for the read voltage value and the second read voltage value among the sequence of differences, thereby providing a sequence of second differences; and determine the calibrated read voltage based on the sequence of second differences and the plurality of read voltages.

In some embodiments, the controller is configured to determine the calibrated read voltage based on the sequence of second differences and the plurality of read voltages by identifying, from the at least two read voltage values, a particular read voltage value that provides a minimum second difference among the sequence of second differences, and setting the calibrated read voltage to have the particular read voltage value.

In some embodiments, the control circuitry is configured to: iteratively change the read voltage from an initial read voltage value to a first read voltage value in a first direction, the first direction being one of an increasing direction and a decreasing direction; determine that a difference between a first output value for the first read voltage value and a second output value for a second read voltage value immediately preceding the first read voltage value is smaller than a first threshold; and determine a first calibrated read voltage to have the first read voltage value. A difference between the second output value for the second read voltage value and a third output value for a third read voltage value immediately preceding the second read voltage value can be larger than the first threshold.

In some embodiments, the control circuitry is configured to: iteratively change the read voltage from the initial read voltage value to a third read voltage value in a second direction, the second direction being the other one of the increasing direction and the decreasing direction; determine that a difference between a third output value for the third read voltage value and a fourth output value for a fourth read voltage value immediately preceding the third read voltage value is smaller than a second threshold; and determine a second calibrated read voltage to have the third read voltage value, where the calibrated read voltage is determined based on the first calibrated read voltage and the second calibrated read voltage.

In some embodiments, a difference between the fourth output value for the fourth read voltage value and a fifth output value for a fifth read voltage value immediately preceding the fourth read voltage value is larger than the second threshold.

In some embodiments, the calibrate read voltage is determined to have an expression:

$$V=\beta(X-Y)+Y,$$

where V, X, and Y represent the calibrated read voltage, the first calibrated read voltage, and the second calibrated read voltage, respectively, and $\beta$ is a constant in a range of [0, 1].

In some embodiments, the control circuitry is configured to: iteratively change the read voltage from the initial read voltage value to a third read voltage value in a second direction, the second direction being the other one of the increasing direction and the decreasing direction; determine a first difference between a third output value for the third read voltage value and a fourth output value for a fourth read voltage value immediately preceding the third read voltage value; determine a second difference between the fourth output value for the fourth read voltage value and a fifth output value for a fifth read voltage value immediately preceding the fourth read voltage value; determine a difference between the first difference and the second difference is smaller than a second threshold; and determine a second calibrated read voltage to have the second read voltage value, where the calibrated read voltage is determined based on the first calibrated read voltage and the second calibrated read voltage.

In some embodiments, the calibrated read voltage is determined to have an expression:

$$V=\beta(X-Y)+Y,$$

where V, X, and Y represent the calibrated read voltage, the first calibrated read voltage, and the second calibrated read voltage, respectively, and $\beta$ is a constant in a range of [0, 1].

In some embodiments, the calibrated read voltage is an initial value in the sequence of read voltage values is a default value.

Another aspect of the present disclosure features a memory device including: a memory array including a plurality of pages of memory cells coupled to a plurality of corresponding word lines; analog-to-digital converter (ADC) circuitry coupled to the memory array and configured to: when data stored in a page is read out by applying each of a plurality of read voltages on a word line corresponding to the page, accumulate currents from multiple memory cells in the page to generate a respective output value that corresponds to the accumulated currents for the read voltage; and a controller configured to determine a calibrated read voltage for the page based on the respective output values associated with the plurality of read voltages and the plurality of read voltages.

In some embodiments, the ADC circuitry includes the controller.

In some embodiments, the memory device includes control circuitry coupled to the memory array and configured to apply each of the plurality of read voltages on the word line by successively applying a read voltage at a sequence of read voltage values.

A further aspect of the present disclosure features a method including: applying a plurality of read voltages on a word line corresponding to a page of memory cells in a memory device; for each read voltage of the plurality of read voltages, accumulating read-out signals from multiple memory cells in the page to generate a respective output value corresponding to the accumulated read-out signals for the read voltage; and determining a calibrated read voltage for the page based on the respective output values associated with the plurality of read voltages and the plurality of read voltages.

In some embodiments, determining the calibrated read voltage for the page includes: for each of at least two of the plurality of read voltages, determining a respective difference between a first output value for the read voltage and a second output value for a second read voltage immediately preceding the read voltage among the plurality of read voltages, thereby providing a sequence of differences; and determining the calibrated read voltage based on the sequence of differences and the plurality of read voltages.

In some embodiments, determining the calibrated read voltage based on the sequence of differences and the plurality of read voltages includes: for each of the at least two of the plurality of read voltages, determining a second difference between a first difference for the read voltage value and a second difference for the second read voltage value among the sequence of differences, thereby providing a sequence of second differences; and determining the calibrated read voltage based on the sequence of second differences and the plurality of read voltages.

Implementations of the above techniques include methods, systems, computer program products and computer-readable media. In one example, a method can be performed a memory and the method can include the above-described actions performed by the memory, e.g., the actions for determining read voltages for the non-volatile memory. In another example, one such computer program product is suitably embodied in a non-transitory machine-readable medium that stores instructions executable by one or more processors. The instructions are configured to cause the one or more processors to perform the above-described actions. One such computer-readable medium stores instructions that, when executed by one or more processors, are configured to cause the one or more processors to perform the above-described actions.

The details of one or more disclosed implementations are set forth in the accompanying drawings and the description below. Other features, aspects, and advantages will become apparent from the description, the drawings and the claims.

DETAILED DESCRIPTION

Figure 1A:
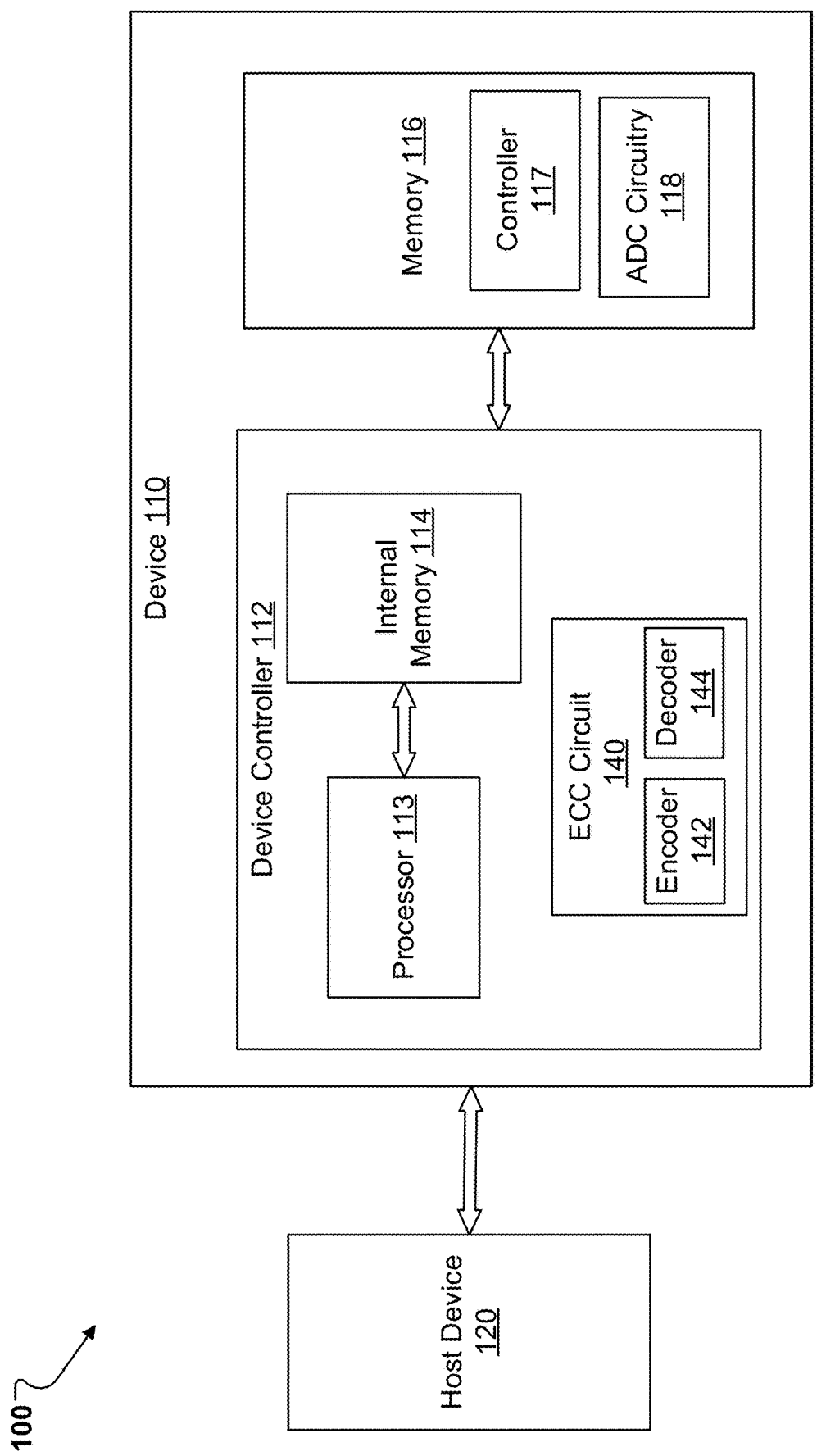
FIG. 1A illustrates an example of a system, according to one or more implementations of the present disclosure.

Due to frequent read operations, a memory may suffer from read disturbance, in which states of memory cells, e.g., an erased state and one or more programmed states, in the memory may have increased or decreased threshold voltages. The read disturbance may cause failed bits (or error bits) in reading the data. An error-correcting code (ECC) decoder can be configured to decode the data read from the memory to detect and correct, up to an error correction capability of an ECC scheme, any bit errors that may be present in the data. Data can be read from memory cells by sensing a state of each memory cell by comparing a cell threshold voltage to a read voltage (or a reference read voltage).

A key challenge of 3D memory systems, e.g., 3D NAND flash memory, has been reducing error bits and enhancing read performance. However, the threshold voltage Vt distribution of a 3D NAND flash memory is affected by a number of conditions, e.g., layer variation, program/erase (P/E) cycling, temperature, retention time, and page address, which cause an optimal read voltage not to be fixed. The optimal read voltage indicates that a minimum change, e.g., a minimum number of error bits is obtained when the read voltage is applied.

In some conventional techniques, a preset read voltage is used for reading data from a memory, no matter how input parameters change. However, the preset read voltage can be far from an optimal read voltage, leading to an additional overhead for ECC decoding.

In another conventional technique, a lookup table storing multiple preset read voltages is used. The preset read voltages are in used a static order according to corresponding priority levels that are independent of input parameters. Data is first read with a first preset voltage having the highest priority; if a reading output of the data fails to pass an ECC test, a second preset voltage having the second highest priority is then used. The retry read process continues until the reading output passes the ECC test. However, the lookup table construction can cost a great amount of human resources and developing time. Engineers may have to fine tune optimal read voltages case by case based on the input parameters. The table size can become larger and larger with different process technologies and different operating conditions.

Machine learning (ML) technology has been proposed to be used to determine an optimal read voltage. For example, offline inference by machine learning could be used to determine a relationship between input parameters and an optimal read voltage. However, such offline inference can cause a huge memory overhead to achieve high accuracy. Online inference can require additional computing and time overhead that degrades read latency.

A valley search approach has also been proposed to determine an optimal read voltage. In the valley search technique, bits are counted at a succession of different voltages, and a change in bit count resulting from each change in read voltage is observed. The voltage with minimum change in bit count can correspond to the bottom of the valley, and can provide the best read voltage. However, it takes a long time to count the number of bits, which may be implemented by hardware circuits.

Overall, determining an optimal read voltage can be time-consuming and tedious, and the computing time and power consumption can increase as the number of input parameters considered in the determining process. Therefore, it would be desirable to develop techniques that can read accurately with a limited read latency over a time-variant channel and can reduce ECC decoding overhead via optimal read voltages.

Implementations of the present disclosure provide systems, methods, and techniques for determining read voltages, e.g., calibrated read voltages, for memory systems, e.g., non-volatile memory (NVM) systems. The techniques can calibrate (or optimize) read voltages by an on-memory chip valley search scheme by analog-to-digital converter (ADC) circuitry to minimize the number of incorrect bits, which can reduce ECC decoding overhead, reduce extra memory overhead, reduce read latency, reduce developing costs, and improve read accuracy. Herein the term "calibrated read voltage" represents a read voltage calibrated using the on-memory chip valley search scheme by the ADC circuitry. The calibrated read voltage can be an optimum read voltage corresponding to a minimum change, e.g., a minimum value or a minimum number of error bits.

In some implementations, ADC circuitry is implemented in the memory. The ADC circuitry can include an accumulating circuit configured to accumulate currents from multiple bits during a read operation to obtain a sum of the currents. The accumulating circuit can include an ADC configured to convert an analog signal of the sum of the currents to a digital value. The ADC circuitry enables to gain a faster counting time, e.g., during a valley search to determine a calibrated read voltage (or an optimal read voltage).

In some cases, the memory stores a predetermined read voltage, e.g., determined by a manufacture of the memory based on, for example, empirical data. A controller can be implemented in the ADC circuitry itself or in the memory and external to the ADC circuitry. The predetermined read voltage can be calibrated to be a calibrated read voltage (or an optimized read voltage) for a particular page or block. For example, starting from the predetermined read voltage, a succession of different read voltages can be tested as part of a valley search. For each tested voltage, the ADC circuitry accumulates currents from multiple memory cells on a page corresponding to a word line, obtains a sum of the currents, and coverts the sum into a digital value. The controller can compare the digital values from the success of different read voltages, determines a calibrated read voltage based on the multiple digital values and the different read voltages. In particular, the read voltage that provides the smallest change in bit count can correspond to the bottom of the valley, and can provide the optimal or calibrated read voltage. To improve accuracy, the controller can also compare first differences between digital values for adjacent read voltages or even second differences between adjacent first differences to determine the bottom of the valley.

In some cases, instead of operating in a current mode, e.g., accumulating currents for multiple bits in a read operation, the ADC circuitry can be configured to operate in a voltage mode, e.g., accumulating voltages for the multiple bits during the read operation, or in a hybrid mode including both the current mode and the voltage mode.

Conventional memory devices or systems does not include such ADC circuitry or use ADC circuitry in such a manner. Use of the ADC circuitry enables accumulation of currents and outputs a digital value to gain faster bit counting time and reduce data counting operation with higher energy efficiency and read speed. Implementation of ADC circuitry in the memory also allows for reduced error bits to gain higher accuracy and reduced ECC decoding overhead.

The techniques can be applied to various types of volatile memory devices or non-volatile memory devices, such as NAND flash memory, NOR flash memory, resistive random-access memory (RRAM), phase-change memory (PCM) such as phase-change random-access memory (PCRAM), spin-transfer torque (STT)-Magnetoresistive random-access memory (MRAM), among others. The techniques can also be applied to charge-trapping based memory devices, e.g., silicon-oxide-nitride-oxide-silicon (SONOS) memory devices, and floating-gate based memory devices. The techniques can be applied to two-dimensional (2D) memory devices or three-dimensional (3D) memory devices. The techniques can be applied to various memory types, such as SLC (single-level cell) devices, MLC (multi-level cell) devices like 2-level cell devices, TLC (triple-level cell) devices, QLC (quad-level cell) devices, or PLC (penta-level cell) devices. Additionally or alternatively, the techniques can be applied to various types of devices and systems, such as secure digital (SD) cards, embedded multimedia cards (eMMC), or solid-state drives (SSDs), embedded systems, among others.

FIG. 1A illustrates an example of a system 100 that includes a device 110 and a host device 120. The device 110 includes a device controller 112 and a memory 116. The device controller 112 includes a processor 113 and an internal memory 114.

In some implementations, the device 110 is a storage device. For example, the device 110 can be an embedded multimedia card (eMMC), a secure digital (SD) card, a solid-state drive (SSD), or some other suitable storage. In some implementations, the device 110 is a smart watch, a digital camera or a media player. In some implementations, the device 110 is a client device that is coupled to a host device 120. For example, the device 110 is an SD card in a digital camera or a media player that is the host device 120.

The device controller 112 is a general-purpose microprocessor, or an application-specific microcontroller. In some implementations, the device controller 112 is a memory controller for the device 110. The following sections describe the various techniques based on implementations in which the device controller 112 is a memory controller. However, the techniques described in the following sections are also applicable in implementations in which the device controller 112 is another type of controller that is different from a memory controller.

The processor 113 is configured to execute instructions and process data. The instructions include firmware instructions and/or other program instructions that are stored as firmware code and/or other program code, respectively, in the secondary memory. The data includes program data corresponding to the firmware and/or other programs executed by the processor, among other suitable data. In some implementations, the processor 113 is a general-purpose microprocessor, or an application-specific microcontroller. The processor 113 is also referred to as a central processing unit (CPU).

The processor 113 accesses instructions and data from the internal memory 114. In some implementations, the internal memory 114 is a Static Random Access Memory (SRAM) or a Dynamic Random Access Memory (DRAM). For example, in some implementations, when the device 110 is an eMMC, an SD card or a smart watch, the internal memory 114 is an SRAM. In some implementations, when the device 110 is a digital camera or a media player, the internal memory 114 is DRAM.

In some implementations, the internal memory is a cache memory that is included in the device controller 112, as shown in FIG. 1A. The internal memory 114 stores instruction codes, which correspond to the instructions executed by the processor 113, and/or the data that are requested by the processor 113 during runtime.

The device controller 112 transfers the instruction code and/or the data from the memory 116 to the internal memory 114. In some implementations, the memory 116 is a non-volatile memory that is configured for long-term storage of instructions and/or data, e.g., a NAND flash memory device, or some other suitable non-volatile memory device. In implementations where the memory 116 is NAND flash memory, the device 110 is a flash memory device, e.g., a flash memory card, and the device controller 112 is a NAND flash controller. For example, in some implementations, when the device 110 is an eMMC or an SD card, the memory 116 is a NAND flash; in some implementations, when the device 110 is a digital camera, the memory 116 is an SD card; and in some implementations, when the device 110 is a media player, the memory 116 is a hard disk.

In some implementations, the device controller 112 is configured to receive data and instructions from and to send data to the host device 120. The device controller 112 is further configured to send data and commands to the memory 116 and to receive data from the memory 116. For example, the device controller 112 is configured to send data and a write command to instruct the memory 116 to store the data to a specified address. As another example, the device controller 112 is configured to receive a read request (or a read command) from the host device 120 and send a corresponding read command to the memory 116 to read data from a specified address in the memory 116.

In some implementations, the device controller 112 includes an ECC circuit 140. The ECC circuit 140 can include an ECC encoder 142 and an ECC decoder 144. The ECC encoder 142 can be configured to receive data to be stored to the memory 116 and to generate a codeword, e.g., by encoding the data using an ECC encoding scheme. The ECC encoder 142 can include a Reed Solomon encoder, a Bose-Chaudhuri-Hocquenghem (BCH) encoder, a low-density parity check (LDPC) encoder, a Turbo Code encoder, or any combination thereof. The ECC decoder 144 can be configured to decode data read from the memory 116 to detect and correct, up to an error correction capability of the ECC scheme, any bit errors that may be present in the data. In some implementations, the ECC circuit 140 is included in the memory 116. In some implementations, the device controller 112 includes a first ECC circuit 140 and the memory 116 includes a second ECC circuit 140.

As discussed with further details below, the device 110 is configured to determine read voltages (e.g., optimal read voltages) for reading data from the memory 116, e.g., in response to read requests from the host device 120. ADC circuitry 118 can be integrated in the memory 116, e.g., during manufacturing the memory 116. A result of the ADC circuitry 118 can be used to read data from the memory 116. In some implementations, the ADC circuitry 118 can be also integrated in the device controller 112. The ADC circuitry 118 can include an accumulating circuit. The accumulating circuit can include an ADC. The memory 116 can also include a controller 117 coupled to the ADC circuitry 118 and configured to determine the read voltages based on outputs of the ADC circuitry 118.

Figure 1B:
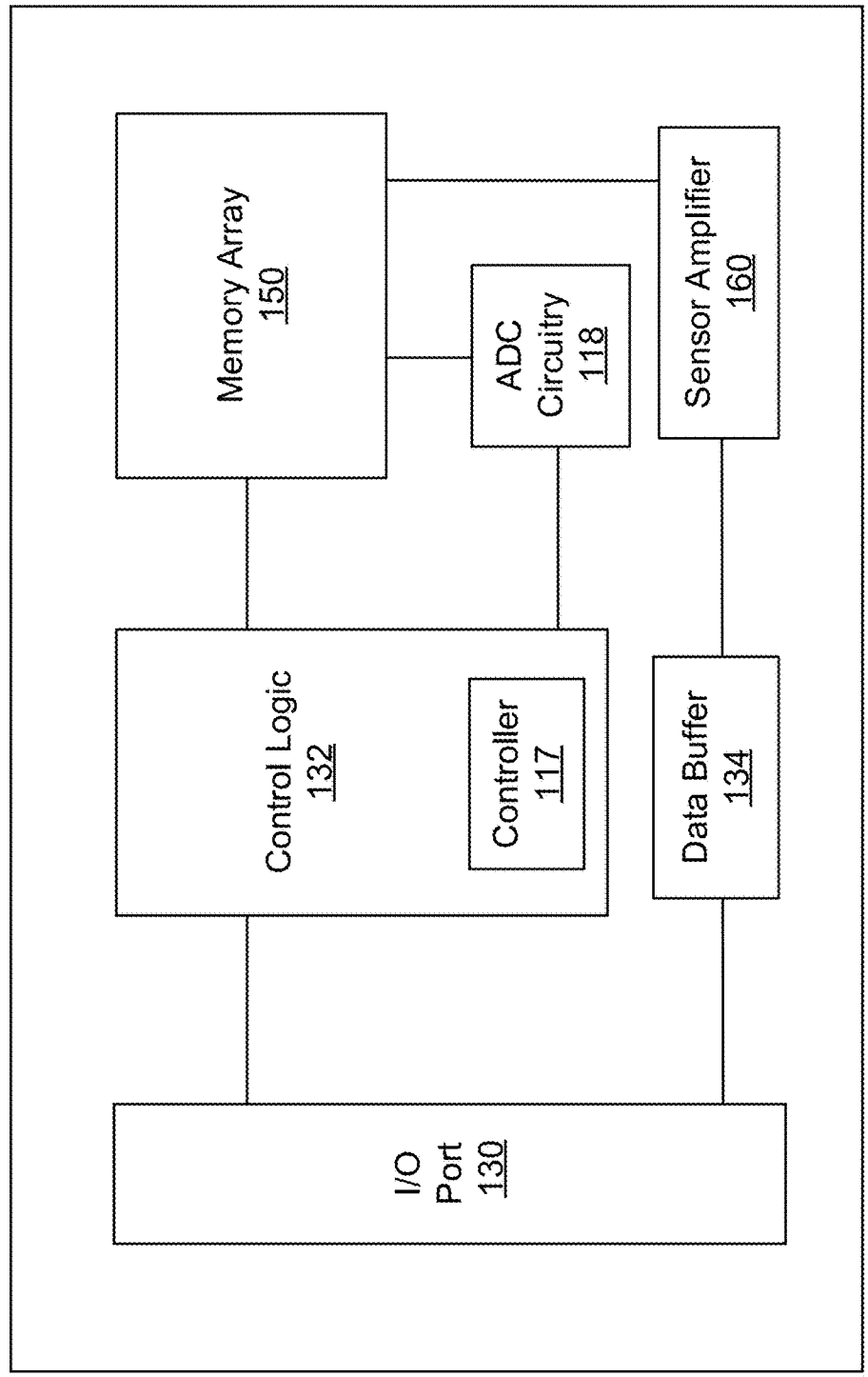
FIG. 1B illustrates a block diagram of an example memory including analog to digital converter (ADC) circuitry, according to one or more implementations of the present disclosure.

FIG. 1B illustrates an example configuration of the memory 116 having a memory cell array 150. The memory cell array 150 can include a number of memory cells coupled in series to a number of row word lines and a number of column bit lines. A memory cell can include a memory transistor configured as a storage element. The memory transistor can include a silicon-oxide-nitride-oxide-silicon (SONOS) transistor, a floating gate transistor, a nitride read only memory (NROM) transistor, or any suitable non-volatile memory MOS device that can store charges. The memory 116 can include an X-decoder (or row decoder) and a Y-decoder (or column decoder). Each memory cell can be coupled to the X-decoder via a respective word line and coupled to the Y-decoder via a respective bit line. Accordingly, each memory cell can be selected by the X-decoder and the Y-decoder for read or write operations through the respective word line and the respective bit line.

The memory 116 includes a memory interface (I/O port) 130 configured to communicate with the device controller 112. The memory 116 can also include a control logic (or control circuitry) 132 coupled to the memory interface 130 and the memory array 150 and configured to control an operation of the memory 116. For example, the control logic 132 can receive a read command from the device controller 112 through the memory interface 130 and reads corresponding data in the memory array 150. The memory 116 can also include a sense amplifier 160 that is connected to the Y-decoder by a data line and a data buffer 134 for buffering an output signal from the sensor amplifier 160 to the memory interface 130.

During a write operation, a data register registers input data from the memory interface 130, and an address generator generates corresponding physical addresses to store the input data in specified memory cells of the memory array 150. The address generator is connected to the X-decoder and Y-decoder that are controlled to select the specified memory cells through corresponding word lines and bit lines. A SRAM buffer can retain the input data from the data register in its memory as long as power is being supplied. The control logic 132 processes a write signal from the SRAM buffer and provides a control signal to a voltage generator that generates a write voltage and provides the write voltage to the X-decoder and the Y-decoder. The Y-decoder is configured to output the write voltage to the bit lines for storing the input data in the specified memory cells.

During a read operation, the control logic 132 provides control signals to a voltage generator and the sense amplifier 160. The voltage generator can provide a voltage to the X-decoder and the Y-decoder for selecting a memory cell. The sense amplifier 160 senses a small power (voltage or current) signal from a bit line that represents a data bit (1 or 0) stored in the selected memory cell and amplify the small power signal swing to recognizable logic levels so the data bit can be interpreted properly by logic outside the memory 116. The data buffer 134 receives the amplified voltage from the sensor amplifier 160 and outputs the amplified power signal to the device controller 112 through the memory interface 130.

In some implementations, as illustrated in FIG. 1B, the memory 116 includes ADC circuitry 118 connected to the memory array 150. The ADC circuitry 118 can be coupled to the control logic 132, e.g., the controller 117. As described with further details below, the controller 117 can be configured to determine calibrated (or optimal) read voltages based on outputs of the ADC circuitry 118 during a read operation. For example, the controller 117 can perform a valley search on a profile of the ADC outputs, e.g., digital values corresponding to accumulated currents of multiple memory cells, versus different read voltages to determine a calibrated read voltage. The control logic 132 can then provide a control signal to the voltage generator to generate the calibrated read voltage. The voltage generator can provide the calibrated read voltage to the X-decoder and the Y-decoder for selecting memory cells to read data with the sensor amplifier 160. The read-out data can be sent out the memory 116 through the memory interface 130 to the ECC decoder 144 for error decoding and correction.

In some implementations, the controller 117 can be included in the ADC circuitry 118 itself. The ADC circuitry 118 can determine a calibrated read voltage and provide information of the calibrated read voltage to the control logic 132 for the generation of the calibrated read voltage. The controller can also be a separate component in the memory 116 or distributed between multiple illustrated and/or unillustrated components.

In some implementations, the memory 116 performs a first read operation by applying a first read voltage to one or more target memory cells of the memory array 150, senses a first output of the first read operation by the ADC circuitry 118, and records the first output. The memory 116 can then perform a second read operation by applying a second read voltage to the one or more target memory cells of the memory array 150, sense a second output of the second read operation by the ADC circuitry 118, and record the second output. A difference between the second read voltage and the first read voltage can be predetermined. In response to a difference between the first output and the second output is substantially identical to zero, the memory 116, e.g., the ADC circuitry 118 or the controller 117, can output the second reading voltage as a calibrated read voltage.

Figure 1C:
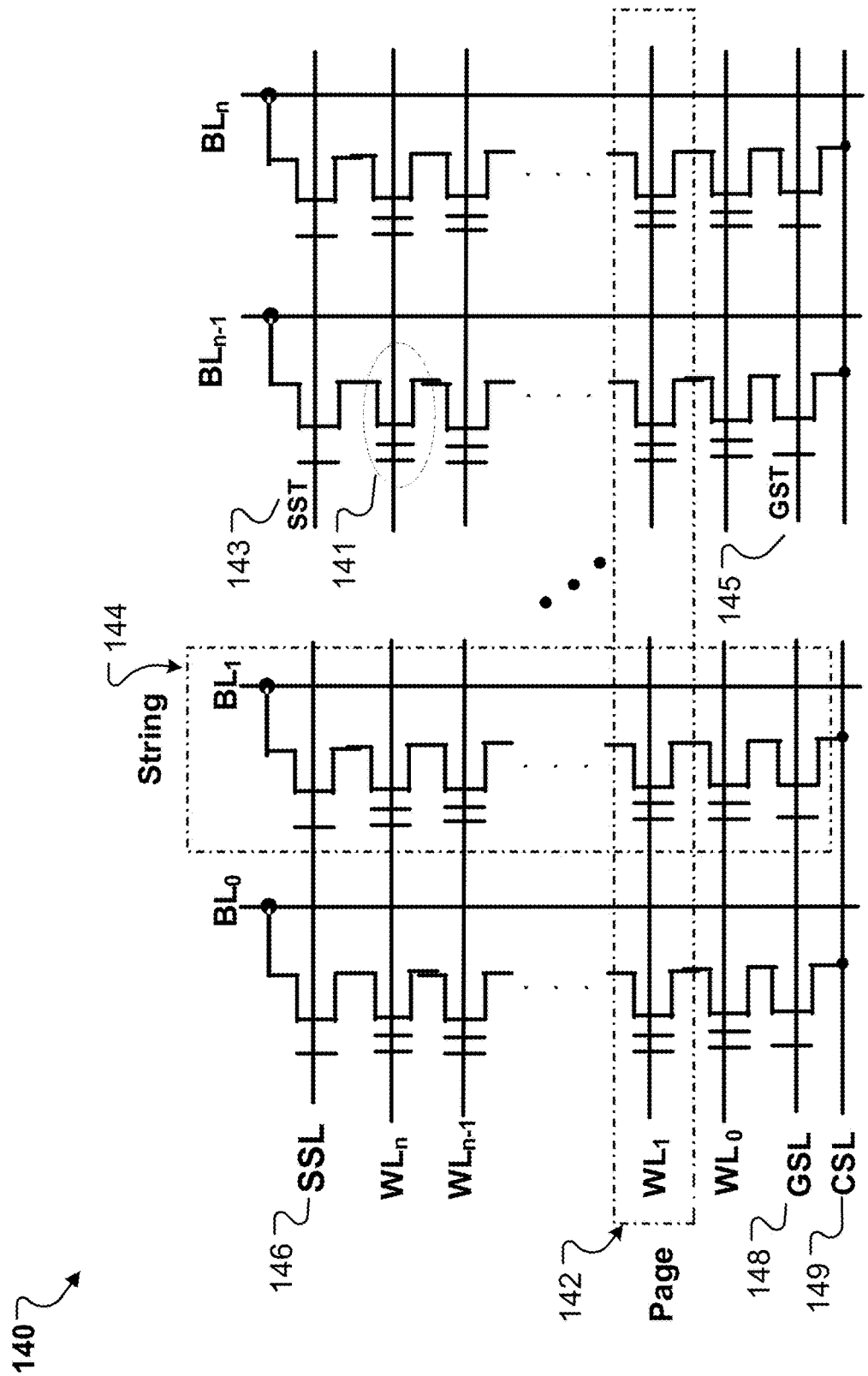
FIG. 1C illustrates an example block of a two-dimensional (2D) memory, according to one or more implementations of the present disclosure.

FIG. 1C illustrates an example configuration of a two-dimensional (2D) memory block 140 when the memory 116 is a 2D memory. The block 140 includes memory cells 141 coupled in series to column bit lines BL0, BL1, . . . , BLn−1, and BLn to form a number of cell strings 144, and to row word lines WL0, WL1, . . . , WLn−1, and WLn to form a number of cell pages 142. A cell string 144 can include a number of memory cells 141, a string select transistor (SST) 143, and a ground select transistor (GST) 145, which are all connected in series. A gate of the SST 143 is connected to a string select line (SSL) 146. Gates of the SSTs in different strings are also connected to the same SSL. Gates of the memory cells 141 are respectively connected to word lines WL0, WL1, ..., WLn−1, WLn. The memory cells 141 are connected to a common source line (CSL) 149 via the GST 145. A gate of the GST 145 is connected to a ground select line (GSL) 148. Gates of the GSTs in different strings are also connected to the same GSL. A cell page 142 can include a number of memory cells 141. Gates of the memory cells 141 in the cell page 142 are coupled in series to a respective word line (WL). When an input voltage is applied to the word line, the input voltage is also applied to the gates of the memory cells 141 in the cell page 142. To read a particular cell page 142 in the block 140 in a read operation, a lower voltage is applied onto a word line corresponding to the particular cell page 142. Meanwhile, a higher voltage is applied onto the other cell pages in the block 140.

The device 110 can include a Flash Translation Layer (FTL) to manage read, write, and erase operations. The FTL can be stored in the device controller 112, e.g., in the internal memory 114. The FTL uses a logical-to-physical (L2P) address mapping table storing mapping from logical pages in a logical block to physical pages in a physical block.

Figure 1D:
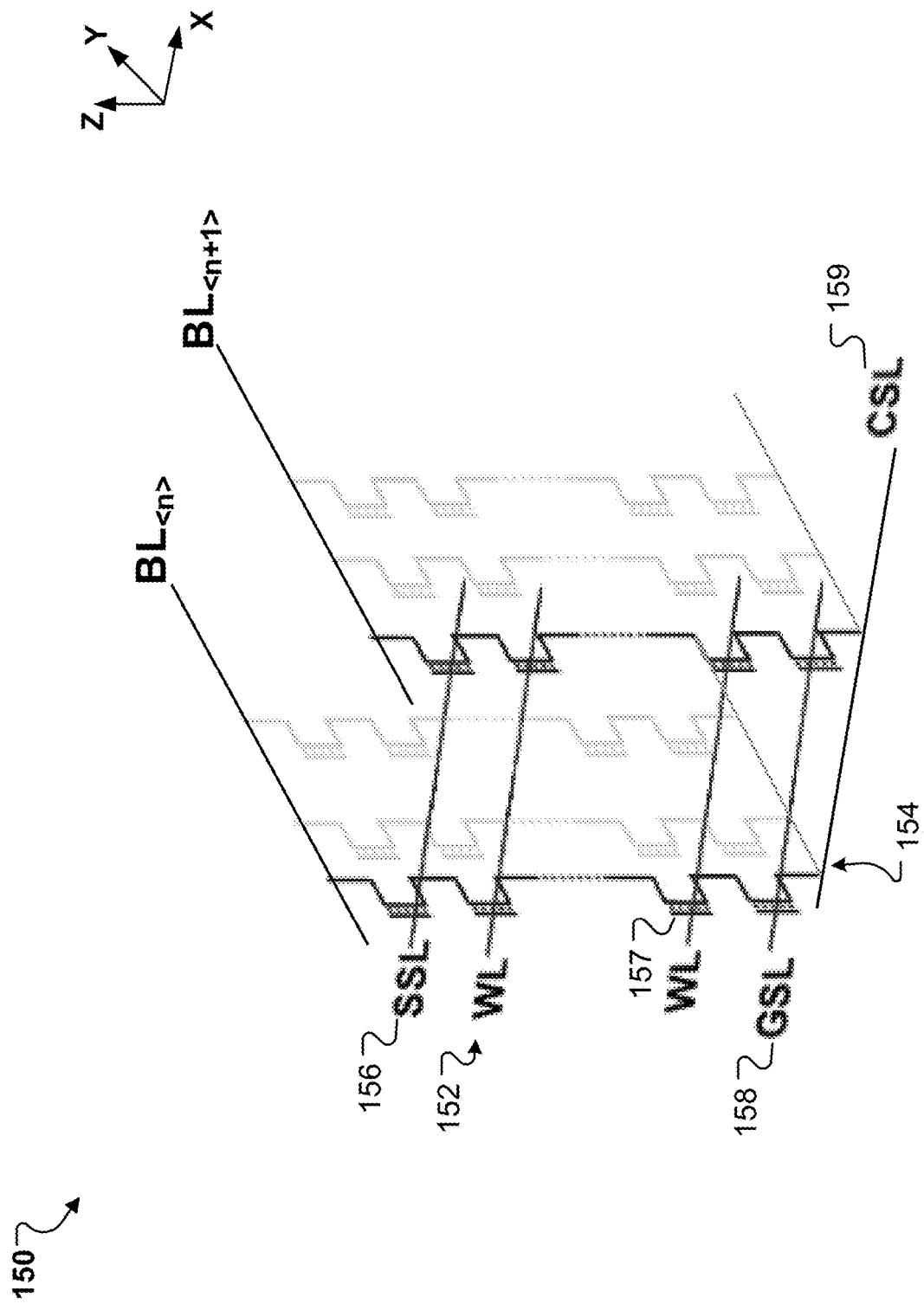
FIG. 1D illustrates an example block of a three-dimensional (3D) memory, according to one or more implementations of the present disclosure.

FIG. 1D illustrates an example 3D memory block 150 when the memory 116 is a 3D memory. Memory cells 157 are arranged in three dimensions, e.g., in an XYZ coordinate system, and coupled to a number of word lines to form a number of cell pages 152 and a number of bit lines $BL_{<n>}$, $BL_{<n+1>}$ to form a number of cell strings 154. A cell string 154 includes a number of memory cells 157 connected in series, where a memory cell can be configured as an SST coupled to a string select line (SSL) 156 and a memory cell can be configured as a GST coupled to a ground select line (GSL) 158. The memory cells 157 are connected to a common source line (CSL) 159 via the GSTs.

The memory block 150 can include a number of memory layers stacked together, e.g., vertically along a Z direction. Each memory layer can be a two-dimensional planar layer, e.g., in an X-Y plane, containing a number of cell pages 152. Each cell page 152 can be individually read and/or programmed. To read a particular cell page 152 in a memory layer 160 in a read operation, a lower voltage is applied onto a word line corresponding to the particular cell page 152. The lower voltage is also applied onto other cell pages 152 in the memory layers. Meanwhile, a higher voltage is applied onto the other memory layers in the block 150.

A memory cell can be in a programmed state or in an erased state. For example, if the memory cell is a SLC, the memory cell can be programmed to a programmed state "0" and be erased to an erased state "1". If the memory cell is an MLC that can store two-bit data. The memory cell can be programmed to any one of programmed states (0,1), (0,0), and (1,0) or erased to the erased state (1, 1).

Once programmed or erased, the memory cell has a corresponding threshold voltage. The threshold voltage is a characteristic of the memory cell. When a read voltage equal to or greater than the threshold voltage is applied to a gate of the memory cell, the memory cell can be turned on. When a read voltage lower than the threshold voltage is applied to a gate of the memory cell, the memory cell can be turned off. The read action is not a programmed or erased action and not intended to change a state of the memory cell.

Threshold voltages of a number of memory cells in a block that correspond to the same state, e.g., the erased state or a programmed state, can have a distribution, e.g., a range between a lower limit voltage and a higher limit voltage. A memory cell having a threshold voltage within the range is considered to be in the corresponding state. In other words, a memory cell being in a state has a threshold voltage within the range.

Figure 2A:
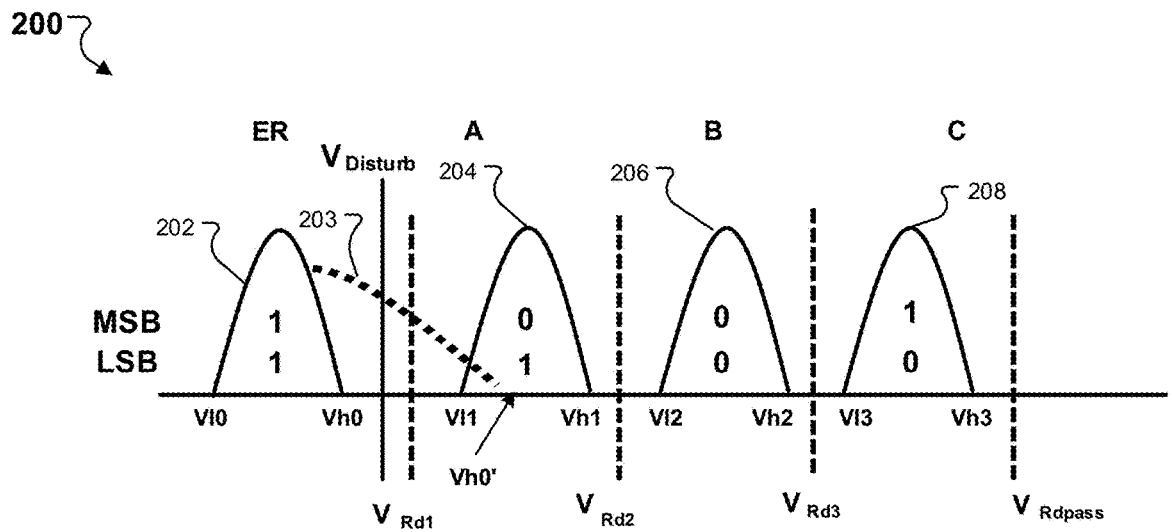
FIG. 2A illustrates an example of threshold voltage distributions of multi-level cell (MLC) memory cells for different states, according to one or more implementations of the present disclosure.

FIG. 2A illustrates an example 200 of threshold voltage distributions and read voltages for different states of a memory cell of a memory, according to one or more implementations. The memory cell can be the memory cell 141 of FIG. 1C or the memory cell 157 of FIG. 1D. The memory can be a NAND flash memory. For illustration purposes only, the memory cell is an MLC capable of storing two-bit data. The memory cell can be programmed or erased to have any one of four states ER, A, B, and C. In some examples, ER is an erased state (1, 1), and A, B, C are programmed states (0, 1), (0, 0), and (1, 0). The states ER, A, B and C have progressively higher read voltages. The MLC NAND flash memory can partition the two bits of each memory cell in a word line across two pages, which are the unit of data programmed at a time. The least significant bits (LSBs) of all memory cells in one word line form the LSB page of the word line, and the most significant bits (MSBs) of these cells on the word line form the MSB page of the word line.

Once programmed or erased, the memory cell has a corresponding threshold voltage. The threshold voltage is a characteristic of the memory cell. The memory cell can be a floating gate transistor. When a read voltage higher than or identical to the threshold voltage is applied to a gate of the memory cell, the memory cell can be turned on. When a read voltage lower than the threshold voltage is applied to a gate of the memory cell, the memory cell can be turned off. The read action is not a programmed or erased action and not intended to change a state of the memory cell.

Each state corresponds to a distribution of threshold voltages in a range between a lower limit voltage and a higher limit voltage. A memory cell having a threshold voltage within the range is considered to be in the corresponding state. In other words, a memory cell being in a state has a threshold voltage within the range. For example, if the memory cell has a threshold voltage between V10 and Vh0, the memory cell is in the state ER; if the memory cell has a threshold voltage between V11 and Vh1, the memory cell is in the state A; if the memory cell has a threshold voltage between V12 and Vh2, the memory cell is in the state B; and if the memory cell has a threshold voltage between V13 and Vh3, the memory cell is in the state C. Curves 202, 204, 206, 208 show threshold voltage distributions of the respective states ER, A, B, C of the memory cell, respectively.

During a read operation, a read voltage can be applied to a word line coupled to a gate of a selected memory cell to determine whether the selected memory cell is a turned-on or turned-off state. When a read voltage $V_{Rd1}$ that is larger than the threshold voltage of ER but smaller than the threshold voltage of A is applied, the memory cell is turned on when it has the state ER and turned off when it has the state A, B, or C; when a read voltage $V_{Rd2}$ that is larger than the threshold voltage of A but smaller than the threshold voltage of B is applied, the memory cell is turned on when it has the state ER or A and turned off when it has the state B or C; when a read voltage $V_{Rd3}$ that is larger than the threshold voltage of B but smaller than the threshold voltage of C is applied, the memory cell is turned on if it has the state ER, A, or B and off when it has the state C. When the read voltage $V_{Rdpass}$ that is larger than all the threshold voltages of the states ER, A, B, C is applied, the memory cell is turned on regardless of whatever state the memory cell had.

During the read operations, other memory cells in the same bit line as the selected memory cell are applied with a pass voltage $V_{Rdpass}$ and are turned on. Thus, if the selected memory cell is turned on under a read voltage $V_{Rd}$, the memory cells in the corresponding bit line form a conductive path, and there will be a current or a voltage change, which can be detected by a current or voltage sensor coupled to the bit line. If the selected memory cell is turned off under the read voltage, the memory cells in the corresponding bit line does not form a conductive path, and there is no current or no voltage change, which can be detected by a current or voltage sensor coupled to the bit line.

Due to repeated read operations, a read disturbance phenomenon may occur. In the read disturb phenomenon, a threshold voltage of the memory cell abnormally increases. As illustrated in FIG. 2A, in some cases, the distribution curve 202 for the erased state ER includes a dotted curve 203, which includes a higher threshold voltage. For example, the new higher limit voltage Vh0' is larger than the higher limit voltage Vh0. When the new higher limit voltage Vh0' is in the threshold voltage range Vl1 and Vh1 of the programmed state A, the erased state ER overlaps with the programmed state A. That is, the memory cell has overlapping states. When a read voltage $V_{Disturb}$ is applied, the memory cell having a threshold voltage in the erased state ER becomes a turned-off state instead of a turned-on state. Thus, by detecting whether the memory cell is on or off under a specific read condition, it can be determined that whether or not the memory cell suffers from read disturbance. In some cases, memory cells being in states having lower threshold voltages, e.g., ER and A, are more susceptible to read disturbance than states having higher threshold voltages, e.g., B and C.

Figure 2B:
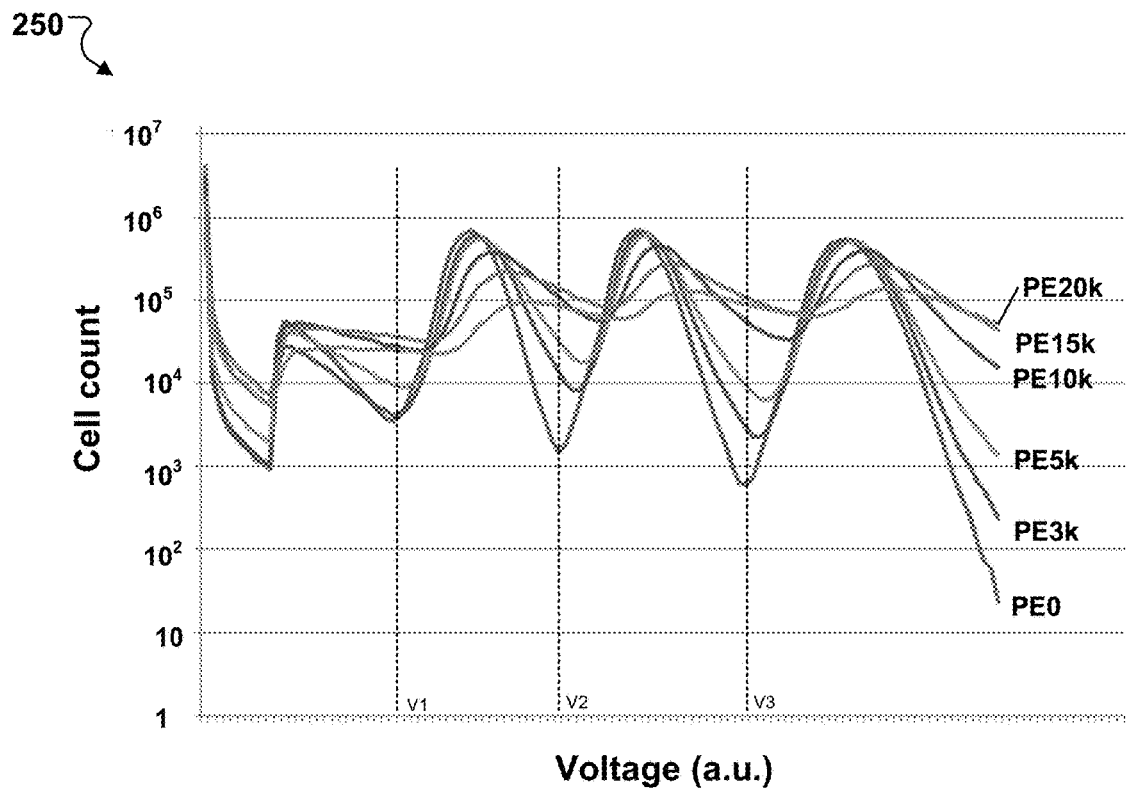
FIG. 2B illustrates an example of relationships between memory cell counts of a reading output and read voltages with different program/erase (P/E) cycle counts of the present disclosure.

FIG. 2B illustrates an example 250 of profiles representing relationships between MLC cell counts and read voltages with different P/E cycles on a memory (0, 3,000 or 3k, 5,000 or 5k, 10,000 or 10k, 15,000 or 15k, 20,000 or 20k). FIG. 2B shows that threshold voltage distributions of memory cells and thus an optimal reading voltage can vary depending on one or more input parameters, e.g., P/E cycles, of the memory cells. A PE0 profile, when there is no P/E cycle, can correspond to a profile of threshold voltage distributions shown in FIG. 2A. A read voltage V1 corresponds to the read voltage $V_{Rd1}$ in FIG. 2A and can be an optimal read voltage to read the erased state ER (1, 1) of memory cells. A read voltage V2 corresponds to the read voltage $V_{Rd2}$ in FIG. 2A and can be an optimal read voltage to read the ER (1, 1) and the programmed state A (0, 1) of memory cells. A read voltage V3 corresponds to the read voltage $V_{Rd3}$ in FIG. 2A and can be an optimal read voltage to read the erased state ER (1, 1), the programmed state A (0, 1), and the programmed state B (0, 0) of memory cells, and the remaining memory cells can be determined to have the programmed state C (1, 0). With the increase of the number of P/E cycles on the memory, the optimal read voltages are increased and the profiles become shallower.

Figure 3:
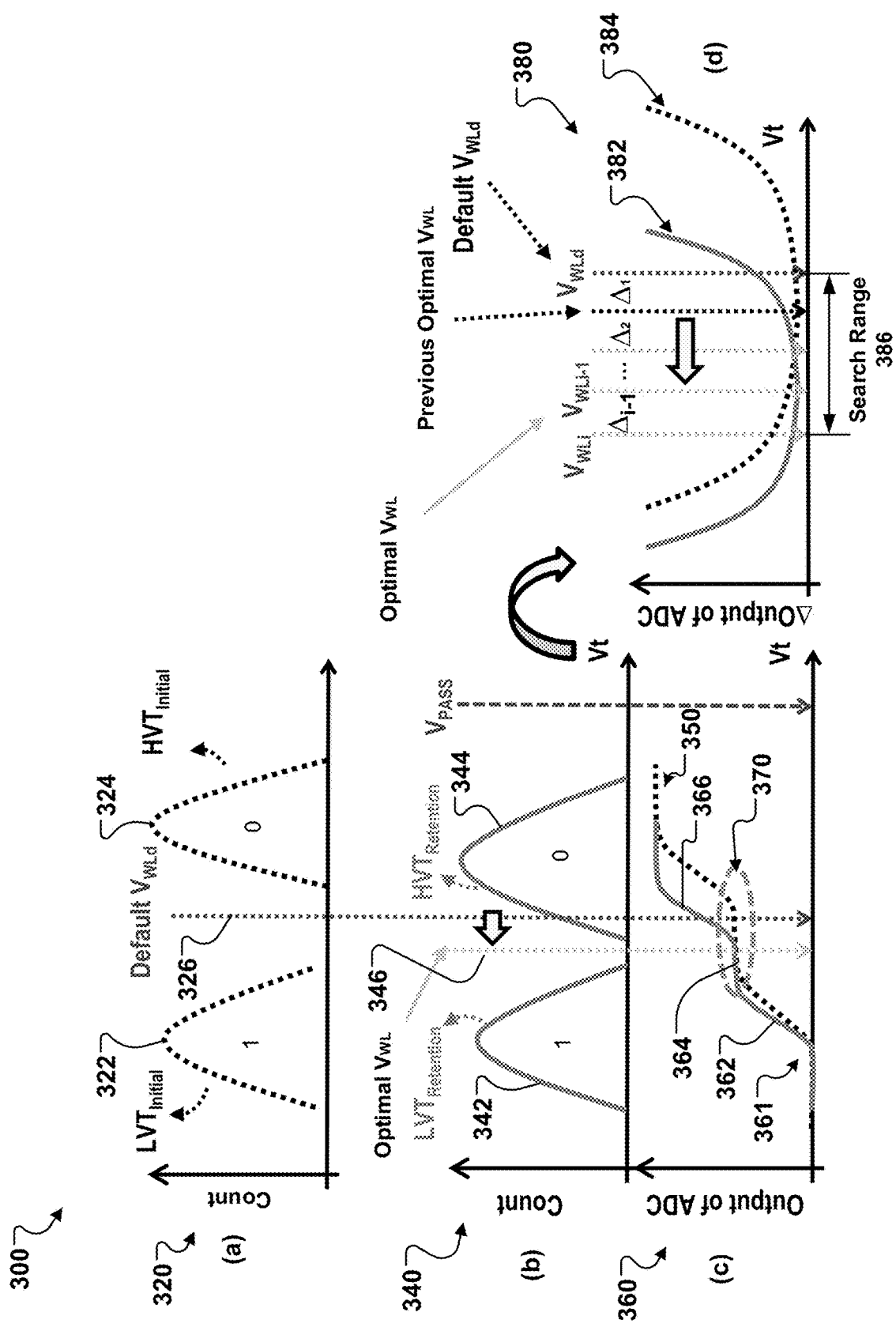
FIG. 3 illustrates an example of a memory for determining read voltages with ADC circuitry in the memory, according to one or more implementations of the present disclosure.

FIG. 3 illustrates an example of a memory for determining read voltages with ADC circuitry in the memory, according to one or more implementations of the present disclosure. The memory can be the memory 116 of FIGS. 1A and 1B. The ADC circuitry can be the ADC circuitry 118 of FIGS. 1A and 1B. The ADC circuitry can be included in the memory. The memory can include a controller, e.g., the controller 117 of FIGS. 1A and 1B, configured to determine calibrated (or optimal) read voltages based on outputs of the ADC. The controller can be included in a control logic, e.g., the control logic 132 of FIG. 1B, in the ADC, or be separated from the control logic and the ADC. For illustration purposes only, memory cells in the memory of FIG. 3 is SLCs capable of storing 1-bit data, i.e., 1 or 0.

Diagram (a) 320 illustrates initial or assumed threshold voltage distributions for states of a memory cell (e.g., an SLC) in the memory, similar to FIG. 2A that shows threshold voltage distributions of states of an MLC. Curve 322 shows an initial threshold voltage distribution $LVT_{Initial}$ for a lower state (e.g., an erase state with bit "1"), and curve 324 shows an initial threshold voltage distribution $HVT_{Initial}$ for a higher state (e.g., a programmed state with bit "0"). Line 326 shows a position of a default read voltage $V_{WLd}$, which is between the threshold voltage ranges of the lower and higher states. The default read voltage $V_{WLd}$ can be stored in the memory, e.g., in the control logic or in the ADC circuitry. In some cases, the default read voltage $V_{WLd}$ is preconfigured by a manufacture of the memory when fabricating the memory. In some cases, the default read voltage $V_{WLd}$ is determined, e.g., periodically updated, based on one or more characteristics of the memory.

As noted above, a memory may suffer from read disturbance or retention, in which states of memory cells, e.g., an erased state and one or more programmed states, in the memory may have increased or decreased threshold voltages. Diagram (b) 340 illustrates an example of a data retention on the threshold voltage distribution for states of a memory cell (e.g., an SLC) in the memory. In this example, curve 342 shows a changed threshold voltage distribution $LVT_{Retention}$ for a lower state (e.g., a programmed state with bit "1"), and curve 344 shows a changed threshold voltage distribution $HVT_{Retention}$ for a higher state (e.g., a programmed state with bit "0") that overlaps the default read voltage $V_{WLd}$. As a result, if the default read voltage $V_{WLd}$ were to be used, bits that are supposed to in one state (e.g., the higher state with bit "0") would be read as being in the other state (e.g., the lower state with bit "1"). Line 346 shows a position of an optimal (or calibrated) read voltage $V_{WL}$ that is between the changed threshold voltage ranges of the lower and higher states, e.g., shown by the distribution curves 342, 344.

To determine the position of the optimal read voltage $V_{WL}$ for reading the memory cell in a memory page, the memory is configured to read the memory page in a read operation using the ADC circuitry. Instead of counting a number of multiple bits to be read out in the memory page for a read voltage, the ADC circuitry can accumulate currents for the multiple bits to be read out in the memory page for the read voltage, which can greatly increase the read speed and thus the determination speed.

Figure 4:
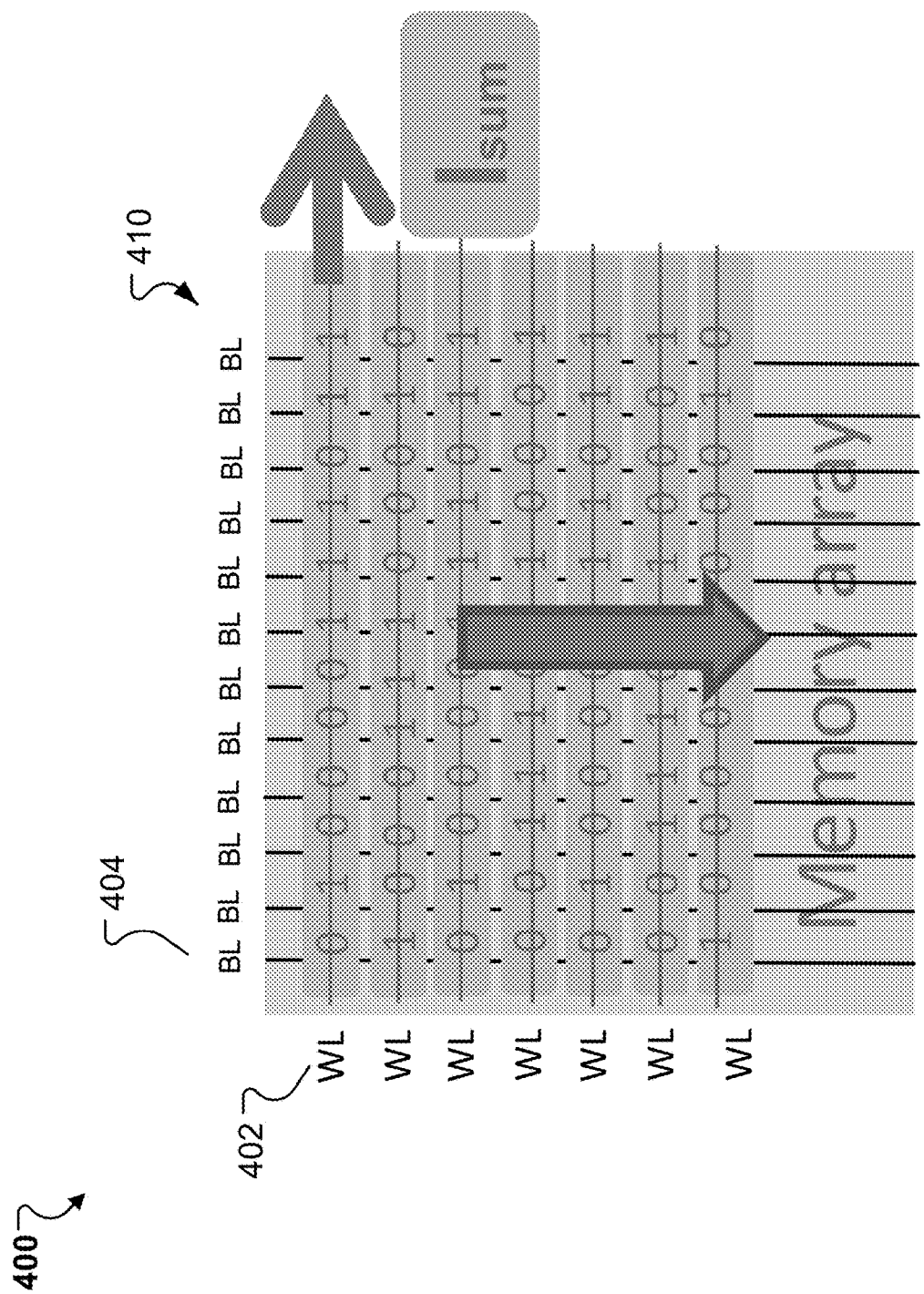
FIG. 4 illustrates an example diagram of combining memory cells with different states in adjacent word lines to represent new states, according to one or more implementations of the present disclosure.

FIG. 4 illustrates an example diagram 400 showing how ADC circuitry accumulates currents for memory cells to be read out, according to one or more implementations. A memory cell array 410 stores a number of memory cells each coupled to a corresponding word line 402 and a corresponding bit line 404. Each memory cell is in an erase state that corresponds to bit "1" or a programmed state that corresponds to bit "0". A page, e.g., the page 142 of FIG. 1C, is connected to a word line 402. When a word line is applied with a read voltage, programmed bits in the corresponding page can be read out. If the bit is "1", there will be a current flowing out. Each time, for each read voltage, the ADC circuitry accumulates currents of memory cells (bits "1") in the page going from left to right horizontally. As illustrated in FIG. 4, for the first word line 402, there will be 6 bits "1" that can cause a current. The ADC circuitry can accumulate the currents from the 6 programmed bits and output a digital current value $I_{sum}$. The digital current value can be stored in the ADC circuitry or in the memory. In comparison, a conventional valley search method is to count the number of bits that contain the bits "1", and needs to count 6 times, which can be slower than just calculating once the digital current value of the 6 bits using the ADC. When the same page is read with a second read voltage, the ADC can clear the previous current value and accumulate the current again for the same page under the second read voltage. In such a way, a profile of output (e.g., the digital current value $I_{sum}$) of the ADC circuitry versus a change of read voltage can be obtained, e.g., as illustrated in diagram (c) 360 of FIG. 3.

Returning to FIG. 3, diagram (c) 360 illustrates an output I of the ADC circuitry as a function of the read voltage. A curve can be generated by iteratively increasing or decreasing a read voltage, e.g., starting from the default $V_{WLd}$. At each read voltage, a read operation is performed and the ADC circuitry is used to accumulate currents from the read memory cells, thereby obtaining a sum of the accumulated currents and converting them to a digital value I. As illustrated in diagram (c) 360, curve 350 shows output I of the ADC circuitry as a function of read voltages for a page with memory cells in initial states (as shown in diagram (a) 320), and curve 361 shows output I of the ADC circuitry as a function of the read voltages for the page with the memory cells in data retention states (as shown in diagram (b) 340). It is shown that the output I of the ADC circuitry changes with the data retention of memory cells. In all read operations, as noted above, a high voltage $V_{PASS}$ is applied to word lines other than the page to be read out.

As shown in diagram (c) 360, the curve 361 includes a first positively sloped portion 362, a flat portion 364, and a second positively sloped portion 366. Below the flat region 364 and in the first positively sloped portion 362, the output of the ADC circuitry decreases as less bits "1" are read out, which decreases the output of the ADC, e.g., the digital value I. Beyond the flat region 364 and in the second positively sloped portion 366, the output of the ADC circuitry increases as more programmed bits "0" are wrongly read out as bits "1". Thus, by placing the read voltage within the flat portion 364, read errors can be reduced, e.g., minimized. As shown in diagram (c) 360, the flat region 364 is between the threshold voltage ranges 342, 344. In the flat region 364, the output of the ADC circuitry is substantially flat as a function of read voltage, which indicates that the optimal read voltage $V_{WL}$, is within the flat region 364.

To more accurately determine a position of the optimal read voltage, data in a portion 370 of the curve 361 including the flat region 364, can be further processed. Diagram (d) 380 illustrates a derivative of the output of the ADC circuitry as a function of the read voltage. For example, curve 382 in diagram (c) 380 can be generated by iteratively decreasing the read voltage, e.g., using voltage $V_{WL1}, V_{WL2}, \ldots, V_{WLk-1}$ $V_{WLk}$, and calculating differences $\Delta_i$ between ADC outputs $I_{i-1}, I_i$, of consecutive (or adjacent) read voltages $V_{WLi-1}$, $V_{WLi}$ used in the calibration process, e.g., $\Delta_i = I_i - I_{i-1}$ When the difference is close to zero or is minimum, a bottom of the curve 382 is identified and accordingly the optimal read voltage is determined. That is, the minimum (e.g., as near the minimum as permitted under practical constraints of time, computing power, circuit footprint, voltage step size, etc.) in the curve 382 provides a calibrated read voltage, e.g., the optimal read voltage $V_{WL}$. For comparison, curve 384 in diagram (c) 380 is also generated based on the portion 370 of the curve 350. It is shown that the optimal $V_{WL}$ becomes smaller than previous optimal $V_{WL}$ that is smaller than the default $V_{WLd}$, which indicates that data retention makes the optimal read voltage gradually smaller.

In some embodiments, the memory, e.g., the controller, can predetermine a search range, e.g., a search range 386 as illustrated in diagram (d) of FIG. 3. The search range 386 can be from an initial voltage, e.g., the default voltage $V_{WLd}$, to a predetermined voltage threshold e.g., $V_{WLi}$. The read voltage can gradually decrease, e.g., by a voltage gap $\Delta V$, from the initial voltage to the predetermined voltage threshold. If the read voltage is still within the search range, the read voltage is kept decreased to obtain a new output value of the ADC circuitry. If the read voltage is out of the search range or beyond the predetermined voltage threshold, that is, read voltages across the entire search range have been used, the memory, e.g., the controller, can determine a calibrated read voltage for the page based on respective output values of the ADC circuitry and the series of read voltages. After the calibrated read voltage is determined, the memory can then use the calibrated read voltage to read data stored in the page.

In some embodiments, the search range can be from an initial voltage to a threshold voltage larger than the initial voltage. In some embodiments, the search range can be from an initial voltage to a threshold voltage smaller than the initial voltage. In some embodiments, the search range can be between first and second threshold voltages, and an initial voltage is larger than the first threshold voltage and smaller than the second threshold voltage. The memory can vary a read voltage first from the initial voltage to the first threshold voltage and then from the initial voltage to the second threshold voltage. The memory can also vary a read voltage first from the initial voltage to the second threshold voltage and then from the initial voltage to the first threshold voltage.

Figure 5:
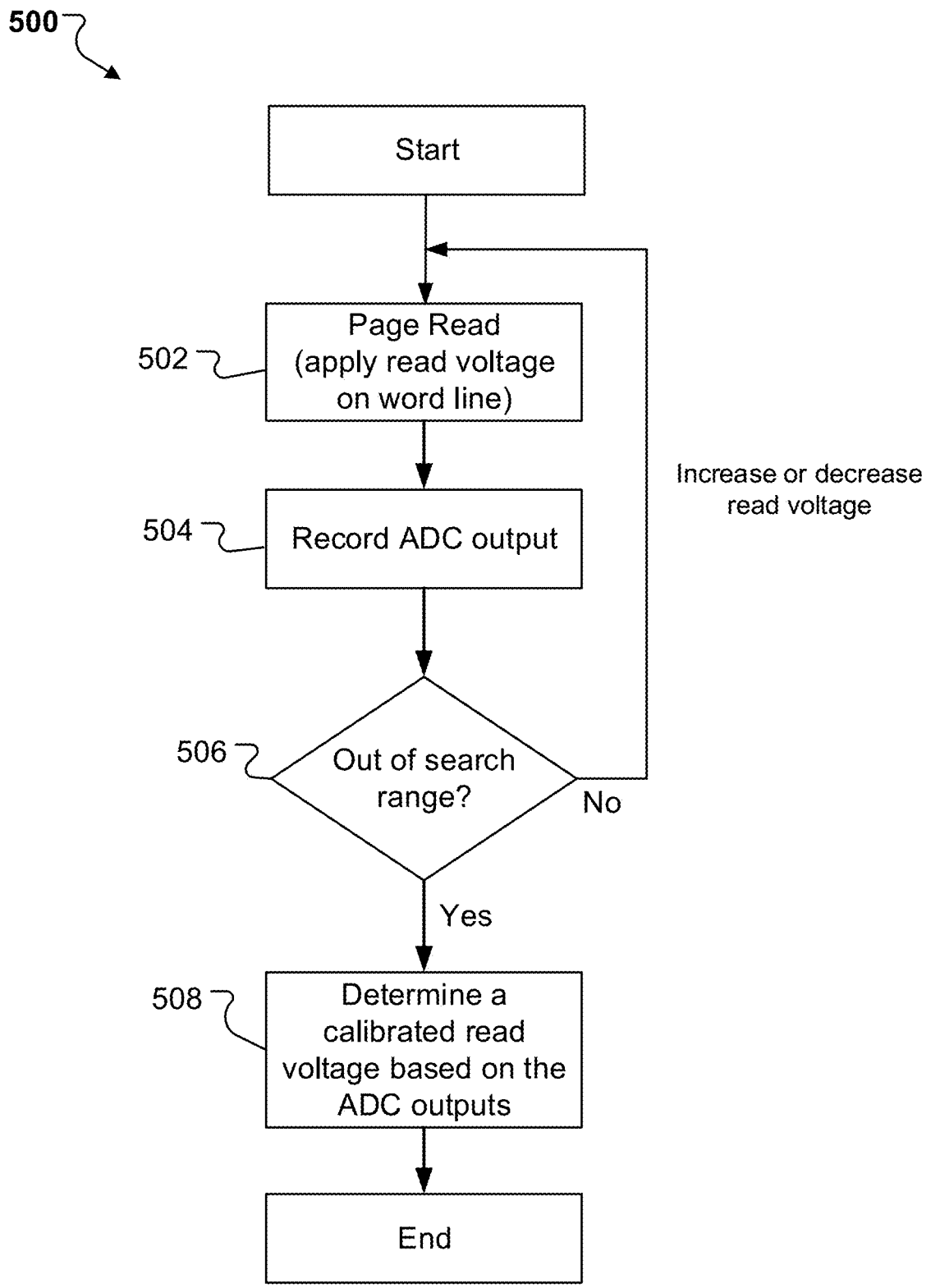
FIG. 5 illustrates an example process of a method of determining read voltages using a valley-tracking scheme with ADC circuitry, according to one or more implementations of the present disclosure.

FIG. 5 illustrates an example process 500 of a method for determining a calibrated read voltage with ADC circuitry in a memory, according to one or more implementations of the present disclosure. The memory can be the memory 116 of FIGS. 1A and 1B. The ADC circuitry can be the ADC circuitry 118 of FIGS. 1A and 1B. The memory can include a controller, e.g., the controller 117 of FIGS. 1A and 1B, configured to determine calibrated (or optimal) read voltages based on outputs of the ADC circuitry. The controller can be included in a control logic, e.g., the control logic 132 of FIG. 1B, in the ADC circuitry, or be separated from the control logic and the ADC circuitry. The process 500 can be performed by the memory. For illustration purposes only, an SLC id used as an example of a memory cell in the memory.

The memory can store data on a page including multiple memory cells. The page, e.g., the page 142 of FIG. 1C or the page 152 of FIG. 1D, corresponds to a word line in the memory. The memory cells can be in different states, e.g., erased state with bit "1" and programmed state with bit "0".

The process 500 starts, e.g., when the memory receives a read request to read the data on the page. The memory can then use the process 500 to determine a calibrated read voltage for the page to read out the data on the page. The process 500 then performs an iterative process of performing a page read (step 502) and recording an output value from the ADC circuitry (step 504).

As illustrated in FIG. 3, the iterative page reading can be provided by applying a series of consecutive read voltages on the word line for the page. The iterative page reading can start with a predetermined read voltage, e.g., a default read voltage preset in the memory. For the iterative page reading, the read voltage can be gradually increased or decreased, e.g., with a voltage gap $\Delta V$, from the predetermined read voltage. In some cases, the voltage gap ΔV between sequential read voltages is fixed. In some cases, the voltage gap ΔV is not fixed and can be dynamically updated. For example, if a read operation needs a faster speed, e.g., the memory prefers a high speed, the voltage gap ΔV can be larger; if the read operation needs a higher accuracy, e.g., close to a position of an optimal read voltage, the voltage gap ΔV can be smaller.

As noted above in FIG. 4, for each read voltage, currents for multiple bits (e.g., bits "1") in the page are accumulated by the ADC circuitry and converted into a corresponding digital value as an output of the ADC circuitry. After storing the output of the ADC circuitry, the memory, e.g., the controller, determines whether the read voltage is out of a search range (e.g., the search range 386 of FIG. 3) (step 506). The search range can be predetermined, e.g., based on empirical data or acceptable read voltage changes. If the read voltage is still within the search range, the read voltage is increased or decreased, e.g., by a voltage gap ΔV, and the process 500 goes back to step 502. If the read voltage is out of the search range, that is, read voltages across the entire search range have been used, the memory, e.g., the controller, determines a calibrated read voltage for the page based on respective output values of the ADC circuitry and the series of read voltages (step 508), e.g., as illustrated in FIG. 3. After the calibrated read voltage is determined, the process 500 ends. The memory can then use the calibrated read voltage to read data stored in the page.

To search or determine the calibrated read voltage, the series of read voltages to be applied can be configured in different implementations. In some implementations, the read voltage is gradually increased from a predetermined read voltage. In some implementations, the read voltage is gradually decreased from the predetermined read voltage. In some implementations, the read voltage is first gradually decreased from the predetermined read voltage to a lower voltage, then gradually increased from the predetermined read voltage to a higher voltage. In some implementations, the read voltage is first gradually increased from the predetermined read voltage to a larger voltage, then gradually decreased from the predetermined read voltage to a lower voltage, e.g., as illustrated with further details in FIG. 6.

Figure 6:
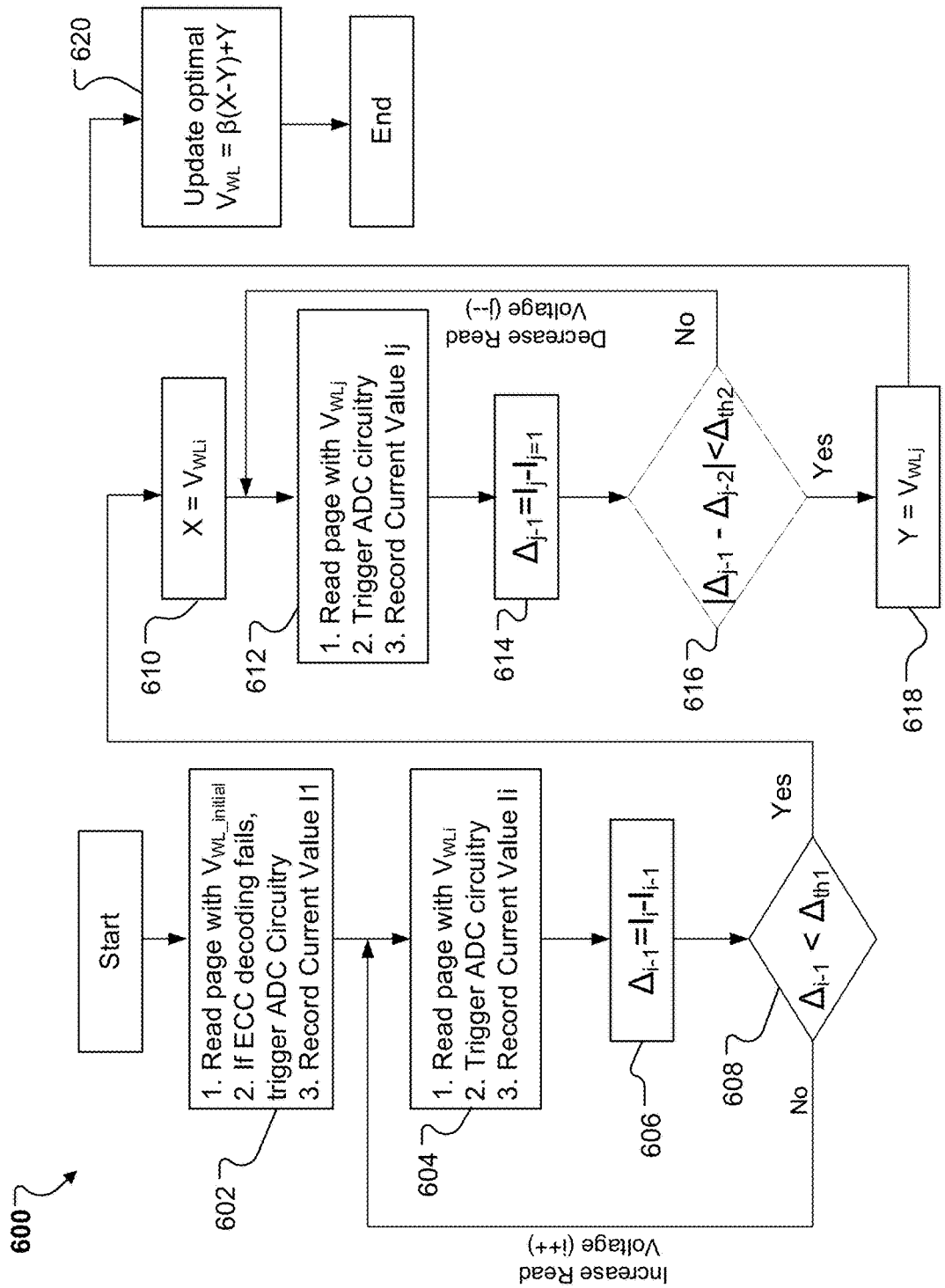
FIG. 6 illustrates an example process of another method of determining read voltages using a valley-tracking scheme with ADC circuitry, according to one or more implementations of the present disclosure.

FIG. 6 illustrates another example process 600 of a method for determining a calibrated read voltage with ADC circuitry in a memory, according to one or more implementations of the present disclosure. The memory can be the memory 116 of FIGS. 1A and 1B. The ADC circuitry can be the ADC circuitry 118 of FIGS. 1A and 1B. The memory can include a controller, e.g., the controller 117 of FIGS. 1A and 1B, configured to determine calibrated (or optimal) read voltages based on outputs of the ADC circuitry. The controller can be included in a control logic, e.g., the control logic 132 of FIG. 1B, in the ADC circuitry, or be separated from the control logic and the ADC circuitry. The process 600 can be performed by the memory.

Similar to the process 500 of FIG. 5, the process 600 starts, e.g., when the memory receives a read request to read the data on the page. The memory can first perform an initial read using an initial read voltage $V_{WL\_initial}$ and obtain an initial read-out data. If ECC decoding of the read-out data, e.g., by the ECC decoder 144 of FIG. 1A, succeeds, e.g., any bit errors that may be present in the data can be detected and corrected, the memory no longer needs to proceed further for the process 600. It indicates that the initial read voltage can be used to read the data on the page. However, if the ECC decoding of the read-out data fails, the memory can then continue proceeding the process 600 to determine a calibrated read voltage for the page to read out the data on the page. The process 600 searches the calibrated read voltage by first gradually increasing from the initial read voltage $V_{WL\_initial}$ to a higher voltage X in a higher voltage search region, e.g., as shown by steps 604, 606, 608, 610, and then gradually decreasing from the initial read voltage $V_{WL\_initial}$ to a lower voltage Y in a lower voltage search region, e.g., as shown by steps 612, 614, 616, 618. Then, the calibrated read voltage can be determined based on output values of the ADC circuitry for the read voltage used during the searching or based on X and Y, e.g., as shown by step 620.

The initial read voltage $V_{WL\_initial}$ can be a predetermined value, e.g., preset by the memory manufacturer based on experience or on known memory properties. The initial read voltage can also be updated based on previous known optimal or calibrated read voltages. In some cases, as each program/erase (P/E) cycle can initial the page, the initial read voltage is set to be the predetermined value set by the memory manufacture.

Similar to steps 502 and 504 of FIG. 5, at step 602, the memory reads the page with the initial read voltage $V_{WL\_initial}$. If the ECC decoding fails, the memory triggers the ADC circuitry to accumulate currents from multiple memory cells on the page corresponding to the word line to obtain a sum of the currents, which can be converted and recorded as a digital current value I1 by the ADC circuitry.

Then the read voltage is increased, e.g., with a voltage gap ΔV. As noted above, the voltage gap can be fixed or dynamically updated based on different criteria. Step 604 is similar to step 602, except that the increased read voltage is used to read the same page. The ADC circuitry accumulates currents from the multiple memory cells on the page to obtain a corresponding digital current value Ii.

At step 606, to increase a determination accuracy, a difference $\Delta_{i-1}$ between the output digital current values I1 and of the ADC circuitry for two consecutive (or adjacent) read voltages $V_{WLi}$, $V_{WLi-1}$ is obtained, e.g., $\Delta_{i-1}=I_i-I_{i-1}$, where i is an integer larger than 1. At 608, the difference $\Delta_{i-1}$ between the output digital current values $I_i$ and $I_{i-1}$ is compared with a first predetermined threshold $\Delta_{th1}$, e.g., based on empirical data. For example, the first predetermined threshold is substantially identical to 0. If the difference $\Delta_{i-1}$ is not smaller than the predetermined threshold, which indicates the read voltage still does not reach the optimal (or calibrated) read voltage, the read voltage can be further increased, e.g., by a voltage gap ΔV. The process 600 then goes back to step 604 and performs a new read operation. The voltage gap can be the same as a previous voltage gap for the read voltage $V_{WLi}$, or can be smaller or larger than the previous voltage gap. Then the process 600 repeats steps 606 and 608, e.g., until the read voltage is out of a search range as illustrated in FIG. 5.

If the difference is smaller than the predetermined threshold $\Delta_{th1}$, which indicates that the read voltage $V_{WLi}$ is substantially close to the optimal read voltage in the higher voltage search region, at step 610, the memory (e.g., the controller) determines a first calibrated read voltage X is identical to the read voltage $V_{WLi}$.

The process 600 then performs searching in the lower voltage search region starting from the initial read voltage. The initial read voltage can be gradually decreased, e.g., by a voltage gap ΔV. The voltage gap ΔV can be the same as or different from that used in the higher voltage search region. At step 612, similar to step 604, the page is read with the decreased read voltage $V_{WLj}$, where j is an integer larger than 1. The ADC circuitry is then triggered to accumulate currents from the multiple bits in the page to obtain a sum of the currents, which is converted and recorded as a digital current value $I_i$ by the ADC circuitry. At step 614, similar to 606, a difference $\Delta_{j-1}$ between the output digital current values $I_j$ and $I_{j-1}$ of the ADC circuitry for two consecutive (or adjacent) read voltages $V_{WLj}$, $V_{Wj-1}$ is obtained, e.g., $\Delta_{j-1}=I_j-I_{j-1}$.

In some implementations, similar to step 608, the difference $\Delta_{j-1}$ between the output digital current values $I_j$ and $I_{j-1}$ can be compared with a predetermined threshold, e.g., based on empirical data. If the difference is not smaller than the predetermined threshold, the read voltage can be further decreased, and the process 600 goes back to step 612. If the difference is smaller than the predetermined threshold, the memory (e.g., the ADC circuitry or the controller) can determine that the read voltage $V_{WLj}$ is substantially close to the optimal read voltage in the lower voltage search region.

In some implementations, to further increase the accuracy, as illustrated in FIG. 6, at 616, a difference between a first difference $\Delta_k$ for first consecutive read voltages $V_{WLj}$, $V_{WLj-1}$, and a second difference $\Delta_{j-2}$ for second consecutive read voltages $V_{WLj-1}$, $V_{WLj-2}$ adjacent to the first consecutive read voltages is determined to be $|\Delta_{j-1}-\Delta_{j-2}|$. Then the difference $|\Delta_{j-1}-\Delta_{j-2}|$ is compared with a second threshold $\Delta_{th2}$ that can be predetermined, e.g., based on empirical data. If the difference is not smaller than the second threshold $\Delta_{th2}$, the read voltage can be further decreased, and the process 600 goes back to step 612. If the difference is smaller than the second threshold $\Delta_{th2}$, the memory (e.g., the ADC circuitry or the controller) can determine that the read voltage $V_{WLj}$ is substantially close to the optimal read voltage in the lower voltage search region. At step 610, the memory (e.g., the controller) determines a second calibrated read voltage Y is identical to the read voltage $V_{WLj}$. In some implementations, X can be also determined according to steps 616 and 618 for determining Y.

At step 620, an optimal read voltage is determined based on at least one of the first calibrated read voltage X or the second calibrated read voltage Y. For example, due to a size of the voltage gap $\Delta V$, Y may be on the left side of the optimal read voltage, and X may be on the right side of the optimal read voltage. As illustrated in FIG. 6, the optimal read voltage can be expressed as:

$$V_{WL}=\beta(X-Y)+Y,$$

where $\beta$ is a constant within [0, 1], e.g., between 0.4 and 0.6. If the voltage distribution of threshold voltages is symmetric, $\beta$ is 0.5. If there is any distortion, R may be 0.4 or 0.6. In some implementations, if the voltage gap $\Delta V$ is small enough, X can be determined to be the optimal read voltage, with $\beta$ being 1, or Y can be determined to be the optimal read voltage, with $\beta$ being 0.

The disclosed and other examples can be implemented as one or more computer program products, for example, one or more modules of computer program instructions encoded on a computer readable medium for execution by, or to control the operation of, data processing apparatus. The computer readable medium can be a machine-readable storage device, a machine-readable storage substrate, a memory device, or a combination of one or more them. The term "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them.

A system may encompass all apparatus, devices, and machines for processing data, including by way of example a programmable processor, a computer, or multiple processors or computers. A system can include, in addition to hardware, code that creates an execution environment for the computer program in question, e.g., code that constitutes processor firmware, a protocol stack, a database management system, an operating system, or a combination of one or more of them.

A computer program (also known as a program, software, software application, script, or code) can be written in any form of programming language, including compiled or interpreted languages, and it can be deployed in any form, including as a standalone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed for execution on one computer or on multiple computers that are located at one site or distributed across multiple sites and interconnected by a communications network.

The processes and logic flows described in this document can be performed by one or more programmable processors executing one or more computer programs to perform the functions described herein. The processes and logic flows can also be performed by, and apparatus can also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and any one or more processors of any kind of digital computer. Generally, a processor will receive instructions and data from a read only memory or a random access memory or both. The essential elements of a computer can include a processor for performing instructions and one or more memory devices for storing instructions and data. Generally, a computer can also include, or be operatively coupled to receive data from or transfer data to, or both, one or more mass storage devices for storing data, e.g., magnetic, magneto optical disks, or optical disks. However, a computer need not have such devices. Computer readable media suitable for storing computer program instructions and data can include all forms of nonvolatile memory, media and memory devices, including by way of example semiconductor memory devices, e.g., EPROM, EEPROM, and flash memory devices; magnetic disks. The processor and the memory can be supplemented by, or incorporated in, special purpose logic circuitry.

While this document may describe many specifics, these should not be construed as limitations on the scope of an invention that is claimed or of what may be claimed, but rather as descriptions of features specific to particular embodiments. Certain features that are described in this document in the context of separate embodiments can also be implemented in combination in a single embodiment. Conversely, various features that are described in the context of a single embodiment can also be implemented in multiple embodiments separately or in any suitable sub-combination. Moreover, although features may be described above as acting in certain combinations and even initially claimed as such, one or more features from a claimed combination in some cases can be excised from the combination, and the claimed combination may be directed to a sub-combination or a variation of a sub-combination. Similarly, while operations are depicted in the drawings in a particular order, this should not be understood as requiring that such operations be performed in the particular order shown or in sequential order, or that all illustrated operations be performed, to achieve desirable results.

Only a few examples and implementations are disclosed. Variations, modifications, and enhancements to the described examples and implementations and other implementations can be made based on what is disclosed.

What is claimed is:

1. A memory device comprising:
    an array of memory cells, each of the memory cells being coupled to a corresponding word line of multiple word lines and a corresponding bit line of multiple bit lines;
    an accumulating circuit coupled to the array of memory cells and configured to:
        when data stored in a page is read out by applying each of a plurality of read voltages on a word line corresponding to the page, the plurality of read voltages being associated with a same state of multiple memory cells in the page, accumulate read-out signals from the multiple memory cells in the page to generate a respective output value that corresponds to the accumulated read-out signals for each of the plurality of read voltages; and
    a controller coupled to the accumulating circuit and configured to determine a value of a calibrated read voltage for the page based on the plurality of read voltages and the respective output values associated with the plurality of read voltages.

2. The memory device of claim 1, wherein the accumulating circuit comprises an analog-to-digital converter (ADC) configured to convert the accumulated read-out signals into the respective output value.

3. The memory device of claim 1, wherein a read-out signal comprises at least one of a current or a voltage.

4. The memory device of claim 1, comprising control circuitry coupled to the array of memory cells,
    wherein the control circuitry is configured to apply each of the plurality of read voltages on the word line by successively applying a read voltage at a sequence of read voltage values.

5. The memory device of claim 4, wherein the control circuitry comprises the controller.

6. The memory device of claim 4, wherein the control circuitry is configured to iteratively increase or decrease the read voltage.

7. The memory device of claim 6, wherein the control circuitry is configured to:
    determine whether the read voltage with a first read voltage value is beyond a threshold voltage;
    in response to determining that the read voltage with the first read voltage value is no more than the threshold voltage, increase or decrease the read voltage to have a second read voltage value to be applied for a following read operation on the page; and
    in response to determining that the read voltage with the first read voltage value is beyond the threshold voltage, activate the controller to determine the calibrated read voltage for the page.

8. The memory device of claim 4, wherein the controller is configured to:
    for each of at least two of the read voltage values in the sequence of read voltage values, determine a difference between respective output values for the read voltage value and a second read voltage value immediately preceding the read voltage value among the sequence of read voltage values, thereby providing a sequence of differences.

9. The memory device of claim 8, wherein the controller is configured to determine the calibrated read voltage based on the sequence of differences and the plurality of read voltages by
    identifying, from the at least two read voltage values, a particular read voltage value that provides a minimum difference among the sequence of differences, and
    setting the calibrated read voltage to have the particular read voltage value.

10. The memory device of claim 8, wherein the controller is configured to:
    for each of the at least two of the read voltage values, determine a second difference between respective differences for the read voltage value and the second read voltage value among the sequence of differences, thereby providing a sequence of second differences; and
    determine the calibrated read voltage based on the sequence of second differences and the plurality of read voltages.

11. The memory device of claim 4, wherein the control circuitry is configured to:
    iteratively change the read voltage from an initial read voltage value to a first read voltage value in a first direction, the first direction being one of an increasing direction and a decreasing direction;
    determine that a difference between a first output value for the first read voltage value and a second output value for a second read voltage value immediately preceding the first read voltage value is smaller than a first threshold; and
    determine a first calibrated read voltage to have the first read voltage value.

12. The memory device of claim 11, wherein the control circuitry is configured to:
    iteratively change the read voltage from the initial read voltage value to a third read voltage value in a second direction, the second direction being the other one of the increasing direction and the decreasing direction;
    determine that a difference between a third output value for the third read voltage value and a fourth output value for a fourth read voltage value immediately preceding the third read voltage value is smaller than a second threshold; and
    determine a second calibrated read voltage to have the third read voltage value, wherein the calibrated read voltage is determined based on the first calibrated read voltage and the second calibrated read voltage.

13. The memory device of claim 11, wherein the control circuitry is configured to:
    iteratively change the read voltage from the initial read voltage value to a third read voltage value in a second direction, the second direction being the other one of the increasing direction and the decreasing direction;
    determine a first difference between a third output value for the third read voltage value and a fourth output value for a fourth read voltage value immediately preceding the third read voltage value;
    determine a second difference between the fourth output value for the fourth read voltage value and a fifth output value for a fifth read voltage value immediately preceding the fourth read voltage value;

determine a difference between the first difference and the second difference is smaller than a second threshold; and determine a second calibrated read voltage to have the second read voltage value, wherein the calibrated read voltage is determined based on the first calibrated read voltage and the second calibrated read voltage.

14. The memory device of claim 13, wherein the calibrated read voltage is determined to have an expression:

$$V=\beta(X-Y)+Y,$$

where V, X, and Y represent the calibrated read voltage, the first calibrated read voltage, and the second calibrated read voltage, respectively, and $\beta$ is a constant in a range of [0, 1].

15. A memory device comprising:
a memory array comprising a plurality of pages of memory cells coupled to a plurality of corresponding word lines;
analog-to-digital converter (ADC) circuitry coupled to the memory array and configured to: when data stored in a page is read out by applying each of a plurality of read voltages on a word line corresponding to the page, accumulate currents from multiple memory cells in the page to generate a respective output value that corresponds to the accumulated currents for the read voltage; and
a controller configured to determine a calibrated read voltage for the page based on the respective output values associated with the plurality of read voltages and the plurality of read voltages.

16. The memory device of claim 15, wherein the ADC circuitry comprises the controller.

17. The memory device of claim 15, comprising control circuitry coupled to the memory array and configured to apply each of the plurality of read voltages on the word line by successively applying a read voltage at a sequence of read voltage values.

18. A method comprising:
applying a plurality of read voltages on a word line corresponding to a page of memory cells in a memory device, the plurality of read voltages being associated with a same state of multiple memory cells in the page;
for each read voltage of the plurality of read voltages, accumulating read-out signals from multiple memory cells in the page to generate a respective output value corresponding to the accumulated read-out signals for the read voltage; and
determining a value of a calibrated read voltage for the page based on the respective output values associated with the plurality of read voltages and the plurality of read voltages.

19. The method of claim 18, wherein determining the calibrated read voltage for the page comprises:
for each of at least two of the plurality of read voltages, determining a respective difference between a first output value for the read voltage and a second output value for a second read voltage immediately preceding the read voltage among the plurality of read voltages, thereby providing a sequence of differences; and
determining the calibrated read voltage based on the sequence of differences and the plurality of read voltages.

20. The method of claim 19, wherein determining the calibrated read voltage based on the sequence of differences and the plurality of read voltages comprises:
for each of the at least two of the plurality of read voltages, determining a second difference between a first difference for the read voltage value and a second difference for the second read voltage value among the sequence of differences, thereby providing a sequence of second differences; and
determining the calibrated read voltage based on the sequence of second differences and the plurality of read voltages.

* * * * *